United States Patent
Nakadaira

(10) Patent No.: US 7,853,430 B2
(45) Date of Patent: Dec. 14, 2010

(54) SEMICONDUCTOR DEVICE, AND TEST CIRCUIT AND TEST METHOD FOR TESTING SEMICONDUCTOR DEVICE

(75) Inventor: Masao Nakadaira, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 391 days.

(21) Appl. No.: 12/013,487

(22) Filed: Jan. 14, 2008

(65) Prior Publication Data

US 2008/0172195 A1 Jul. 17, 2008

(30) Foreign Application Priority Data

Jan. 17, 2007 (JP) ............................... 2007-008424

(51) Int. Cl.
*G06F 19/00* (2006.01)
(52) U.S. Cl. ........................................ 702/173
(58) Field of Classification Search ................. 702/117, 702/19, 118, 182–185, 188
See application file for complete search history.

(56) References Cited

U.S. PATENT DOCUMENTS 7,363,563 B1 * 4/2008 Hissen et al. ............... 714/733

| | | |
|---|---|---|
| 2004/0252751 A1 | 12/2004 | Ogasawara |
| 2004/0252804 A1 | 12/2004 | Aoyama |
| 2005/0156586 A1 | 7/2005 | Kanbayashi |
| 2006/0056564 A1 | 3/2006 | Takeuchi |

FOREIGN PATENT DOCUMENTS

| | | |
|---|---|---|
| JP | 2005-4451 | 1/2005 |
| JP | 2005-5999 | 1/2005 |
| JP | 2005-233933 | 9/2005 |

OTHER PUBLICATIONS

Korean Patent Office issued a Korean Office Action dated Nov. 25, 2009, Application No. 520020416681.

* cited by examiner

*Primary Examiner*—Edward Raymond
(74) *Attorney, Agent, or Firm*—Young & Thompson

(57) ABSTRACT

A semiconductor device includes a CDR (Clock Data Recovery) circuit and a frequency tracking control circuit. The CDR (Clock Data Recovery) circuit executes a clock data recovery on a serial data inputted synchronously with a spread spectrum clock. The frequency tracking control circuit controls a bandwidth of frequency which can be tracked by the CDR circuit.

16 Claims, 12 Drawing Sheets

Fig. 9

SEMICONDUCTOR DEVICE, AND TEST CIRCUIT AND TEST METHOD FOR TESTING SEMICONDUCTOR DEVICE

BACKGROUND OF THE INVENTION

1. Field of the Invention

The present invention relates to a semiconductor device, and a test circuit and a test method for testing a semiconductor device. The present invention more particularly relates to a semiconductor device that treats a serial data inputted synchronously with a spread spectrum clock (SSC), and a test circuit and a test method for testing the semiconductor device.

This application is based upon and claims the benefit of priority from Japanese patent application No. 2007-008424 filed on Jan. 17, 2007, the disclosure of which is incorporated herein in its entirety by reference.

2. Description of Related Art

When a clock generator in an electronic appliance generates a single frequency, radiation of the frequency and harmonic components becomes increased. For this reason, a spread spectrum clock generator is used for performing a frequency modulation on a clock and consequently reducing peaks of the unnecessary radiation and reducing EMI (Electro-Magnetic Interference).

As an example of the spread spectrum clock generator according to a related art, Japanese Laid-Open Patent Application JP-P 2005-4451A (corresponding to US2004252751A1) discloses a spread spectrum clock generator. The spread spectrum clock generator described in JP-P 2005-4451A uses a controller and a phase interpolator and consequently generates a spread spectrum clock without using a voltage controlled oscillator (VCO).

In recent years, as speed of an operation frequency is made higher and skew among bits in a parallel bus becomes severer, a serial interface having no skew among bits becomes popular and is used in a typically usable personal computer (PC) and the like. For example, SATA (Serial Advanced Technology Attachment) is used as the interface standard between a hard disc and CPU. The SATA is the serial interface standard of the first generation with the communication speed of 1.5 Gbps, and includes the standard of the spread spectrum clock as the EMI countermeasure to be used in PC and the like.

A Serializer/Deserializer (SerDes) used in the interface of the standard includes the foregoing spread spectrum clock generator, and a converted serial data is outputted synchronously with the spread spectrum clock. Also, in order to output a parallel data tracking the spread spectrum clock, the deserializer includes a CDR (Clock and Data Recovery) circuit.

As an example of the CDR circuit according to an related art, Japanese Laid-Open Patent Application JP-P 2005-5999A (corresponding to US2004252804A1) discloses a clock and recovery circuit. The CDR circuit described in JP-P 2005-5999A performs a feedback process through a frequency tracking loop and a phase tracking loop on a serial data on which the frequency modulation is performed using the spread spectrum clock. Then, a clock synchronous with the serial data is recovered, Consequently, the CDR circuit described in JP-P 2005-5999A can output a parallel data following the serial data on which the frequency modulation is performed.

On the other hand, as disclosed in Japanese Laid-Open Patent Application JP-P 2005-233933A (corresponding to US2005156586A1), a loop back test is well known as a test method of the SerDes. In the test method described in JP-P 2005-233933A, a pattern data (a parallel data) from a pattern generator is firstly converted into a serial data by a serializer, and the serial data is converted into the parallel data by a deserializer, Next, a pattern comparator compares the pattern data and the converted parallel data and judges the agreement/disagreement.

An operation of a loop back test of a SerDes 300 including a CDR circuit and a SSCG will be described below. FIG. 1 is a block diagram showing a configuration of a test circuit according to a related art. Here, the SerDes 300 is included in an LSI 100 and includes: a deserializer 110 including a CDR circuit 160; and a serializer 12 including a SSCG 17. Also, the LSI 100 includes a pattern generator 13 and a pattern comparator 14, which serve as a loop back test circuit 400. A pattern data 3 outputted by the pattern generator 13 is serial converted by the serializer 12 and outputted as a serial data 4. At this time, the SSCG 17 spectrally-spreads an inputted reference clock signal 1 to generate a spread spectrum clock. The serializer 12 outputs the serial data 4 in synchronization with this spread spectrum clock.

The CDR circuit 160 recovers a synchronous clock from the serial data 4. The deserializer 110 outputs a parallel data 5 converted from the serial data 4 to the pattern comparator 14 in synchronization with a synchronous bit of this serial data 4. The pattern comparator 14 compares the pattern data 3 and the parallel data 5. If the pattern data 3 and the parallel data 5 are coincident, the pattern comparator 14 outputs a judgment signal 6 indicative of "Pass" as a judgment signal 6. If the pattern data 3 and the parallel data 5 are not coincident, the pattern comparator 14 outputs a judgment signal indicative of "Fail" as the judgment signal 6. Such a loop back test can be used to test a clock data recovery performance of the CDR circuit 160.

We have now discovered the following fact. FIGS. 2A and 2B are examples of timing charts in the loop back test according to the related art. The drawings show the judgment results of the loop back test when the CDR circuit 160 is normally operated. FIG. 2A shows the modulation deviation profile of the spread spectrum clock, the frequency limit value (SSC tolerance lower limit value) that can be tracked by the CDR circuit 160, and the Pass/Fail judgment signal 6, when the SSCG 17 is normally operated. FIG. 2B shows the modulation deviation profile of the spread spectrum clock, the frequency limit value (SSC tolerance lower limit value) that can be tracked by the CDR circuit 160, and the Pass/Fail judgment signal 6, when the SSCG 17 is abnormally operated.

With reference to FIG. 2A, when the SSCG 17 is normally operated, the modulation deviation of the spread spectrum clock is equal to or higher than the SSC tolerance lower limit value of the CDR circuit 160. Thus, the CDR circuit 160 can carry out the clock data recovery. Hence, as long as the CDR circuit 160 is normally operated, the pattern comparator 14 outputs a Pass signal.

With reference to FIG. 2B, even if the SSCG 17 is abnormal and the generated spread spectrum clock does not indicate a desirable modulation deviation, when the modulation deviation is equal to or higher than the SSC tolerance lower limit value of the CDR circuit 160, the CDR circuit 160 can carry out the clock data recovery. In this case, the Pass signal is outputted similarly to the foregoing case. That is, independently of the normal or abnormal state of the SSCG, the CDR circuit 160 normally carries out the clock data recovery, and the pattern comparator outputs the signal indicative of "Pass". For this reason, a tester 200 cannot detect the abnormality of the SSCG 17.

Also, although not shown in the drawings, when the SSCG 17 generates the spread spectrum clock at the modulation deviation exceeding the SSC tolerance of the CDR circuit 160 according to the abnormal operation, the CDR circuit 160 cannot carry out the clock data recovery. Thus, the pattern comparator 14 outputs the Fail signal. In this case, the tester 200 cannot point out whether the CDR circuit 160 is abnormal, or the SSCG 17 is abnormal, or both are abnormal.

Thus, the loop back test according to the related art cannot detect the abnormality of the SSCG included in the SerDes. Moreover, even if the CDR circuit is troubled and the SSC tolerance lower limit value is deviated from the desirable values when the modulation deviation of the spread spectrum clock is equal to or higher than this lower limit value, namely, when this exhibits the result as shown in FIG. 2B, it is impossible to detect not only the abnormality of the SSCG, but also the abnormality of the SSC tolerance of the CDR circuit. Thus, this leads to the quality decrease of the product.

SUMMARY

The present invention seeks to solve one or more of the above problems, or to improve upon those problems at least in part. In one embodiment, a semiconductor device includes: a CDR (Clock Data Recovery) circuit configured to execute a clock data recovery on a serial data inputted synchronously with a spread spectrum clock; and a frequency tracking control circuit configured to control a bandwidth of frequency which can be tracked by the CDR circuit.

In the present invention, by controlling frequency tracking performance of the CDR circuit, a bandwidth of frequency where the clock data recovery cannot be executed can be set. This controllable frequency tracking performance, for example, can be used for checking presence or absence of the abnormality of a spread spectrum clock generator.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 9 is a block diagram showing one example of a configuration of a phase detector included in the CDR circuit embodiment according to the present invention;

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device, and a test circuit and a test method for testing a semiconductor device according to the present invention will be described below with reference to the attached drawings. On the drawings, the same or similar reference letters indicate the same, similar or equivalent configuration elements.

A configuration and a test operation of a test circuit for testing a Serializer/Deserializer (SerDes) including a CDR circuit and SSCG will be described below. The test circuit includes an LSI (Large Scale Integration) 10 and a tester 20. The LSI 10 includes the SerDes. The tester 20 judges the presence or absence of the abnormality of the CDR circuit and the SSCG.

First Embodiment

A first embodiment of a configuration and an operation of a test circuit according to the present invention will be described below with reference to FIGS. 1 to 9. Here, the test circuit executes the loop back test.

Figure 3:
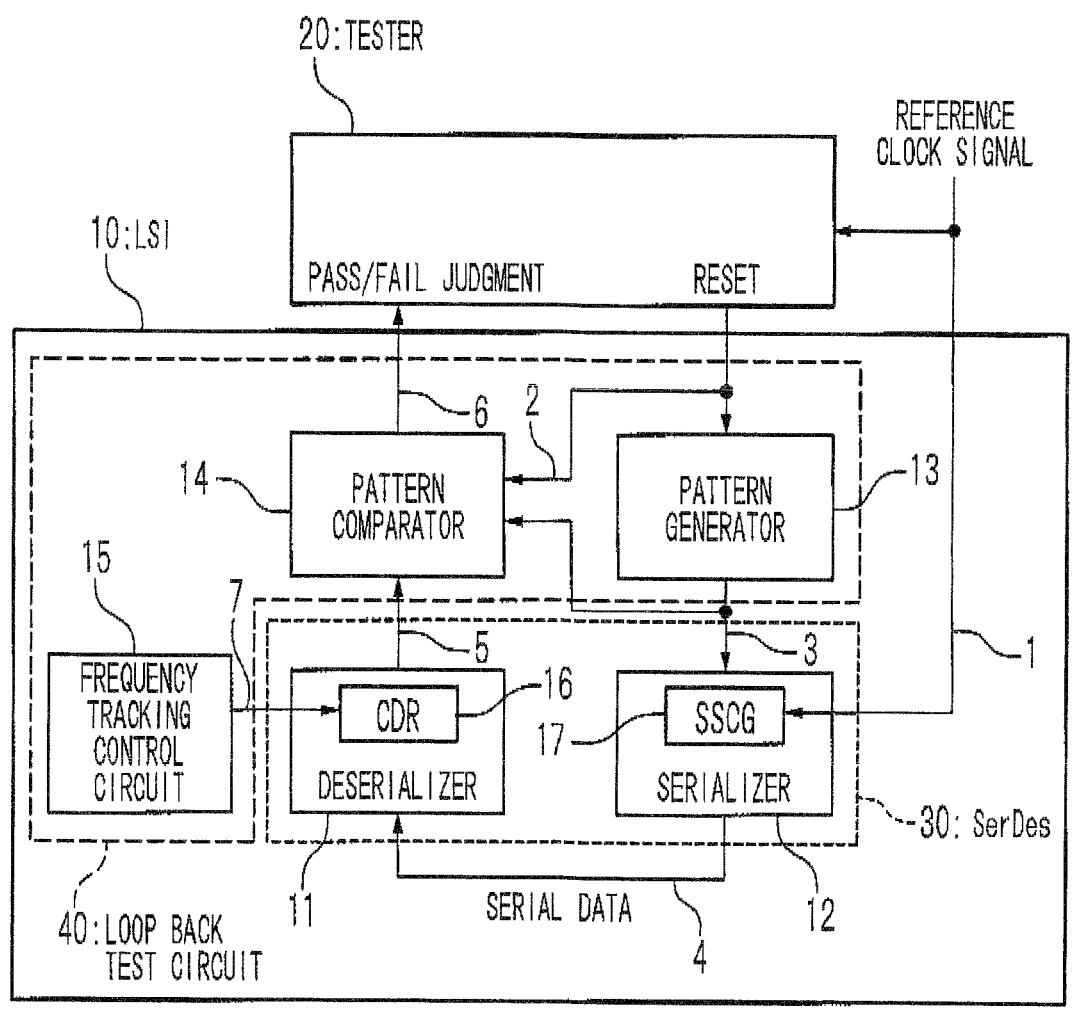
FIG. 3 is a block diagram showing a configuration of a test circuit in a first embodiment according to the present invention.

FIG. 3 is a block diagram showing a configuration of a test circuit in the first embodiment according to the present invention. The LSI 10 includes a SerDes 30 and a loop back test circuit 40. The SerDes 30 includes a deserializer 11 and a serializer 12. The loop back test circuit 40 includes a pattern generator 13, a pattern comparator 14 and a frequency tracking control circuit 15. At a time of a usual operation, the SerDes 30 converts a serial data inputted from outside the LSI 10 into a parallel data by the deserializer 11, and outputs the parallel data to a circuit (not shown) in the LSI 10. Also, the SerDes 30 converts a parallel data inputted from a circuit (not shown) in the LSI 10 into a serial data by the serializer 12, and outputs the serial data through a bus, which is connected to outside the LSI 10, to an external circuit (not shown). Here, the serializer 12 includes an SSCG 17. The SSCG 17 spectrally spreads an inputted reference clock signal 1 at a predetermined modulation frequency and generates a spread spectrum clock. The serializer 12 outputs the serial data converted at a bit rate corresponding to the generated spread spectrum clock. Also, the deserializer 11 includes a CDR circuit 16. The CDR circuit 16 recovers a synchronous clock 8 from the received serial data. The deserializer 11 outputs the parallel data converted at the bit rate corresponding to the recovered synchronous clock 8.

Figure 1:
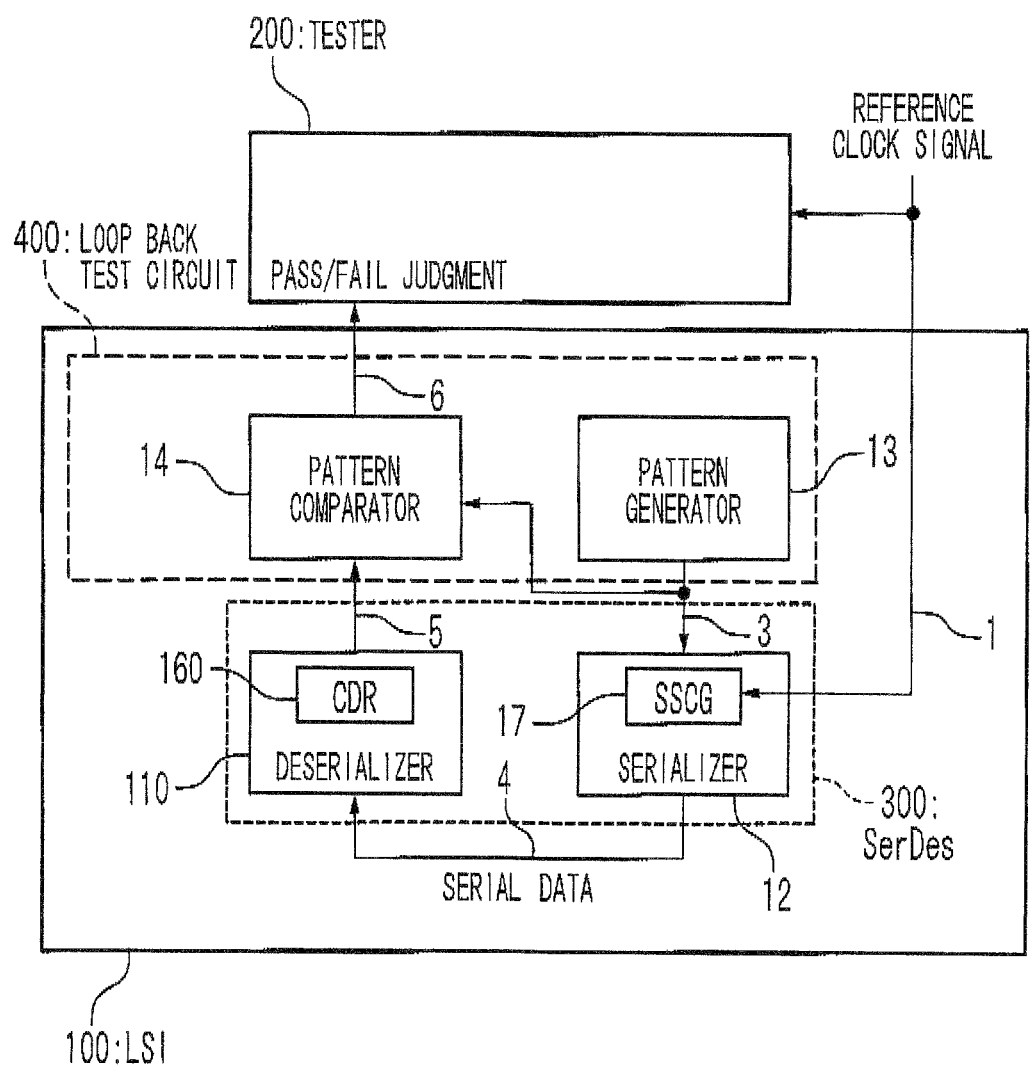
FIG. 1 is a block diagram showing a configuration of a test circuit according to a related art.
Figure 2A:
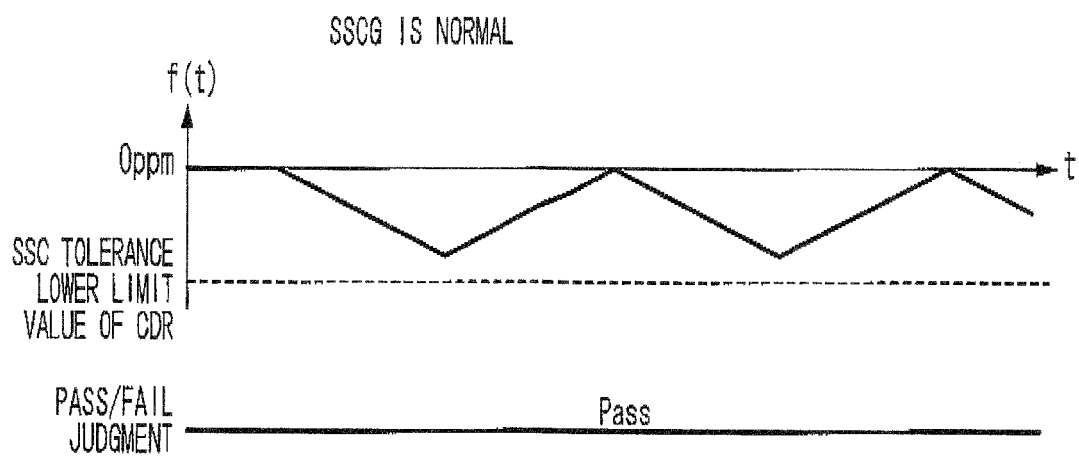
FIGS. 2A and 2B are examples of timing charts in a loop back test according to the related art.
Figure 2B:
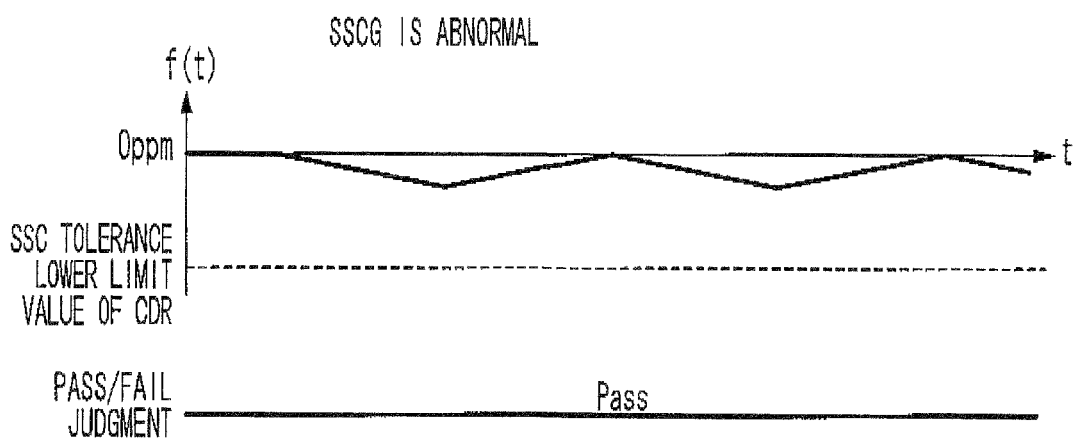

At the time of a test operation, the SerDes 30 is connected to the loop back test circuit 40, as shown in FIG. 1. The loop back test circuit 40 is used when a performance test for the SerDes 30 is executed. The loop back test circuit 40 is connected to the tester 20 at the time of the test operation.

In detail, the pattern generator 13 generates a pattern data 3 as the parallel data for the test, and supplies the pattern data 3 to the serializer 12 and the pattern comparator 14. The serializer 12 outputs a serial data 4, into which the pattern data 3 is serially converted, to the deserializer 11. The deserializer 11 outputs a parallel data 5, into which the serial data is parallel converted, to the pattern comparator 14. The pattern comparator 14 outputs a judgment signal 6 indicative of "Pass" if the pattern data 3 and the parallel data 5 are coincident. The pattern comparator 14 outputs a judgment signal 6 indicative of "Fail" if the pattern data 3 and the parallel data 5 are not coincident. Also, at the time of the test operation, the frequency tracking control circuit 15 outputs a maximal value control signal 7, which controls a clock data recovery performance (SSC tolerance) of the CDR circuit 16, to the CDR circuit 16.

Here, the tester 20 outputs a reset signal 2 to the pattern generator 13 and the pattern comparator 14, at a predetermined cycle based on the reference clock signal 1. The pattern generator 13 outputs the pattern data 3 in response to the reset signal 2. Also, the pattern comparator 14 starts the comparing process between the pattern data 3 and the parallel data 5, in response to the reset signal 2. Consequently, the start bits of the compared pattern data 3 and parallel data 5 are matched to carry out the comparing process. The pattern comparator 14 outputs the judgment signal 6, which corresponds to the comparison result between the pattern data 3 and the parallel data 5, to the tester 20. The tester 20 detects the presence or absence of the abnormality of the CDR circuit 16 and the SSCG 17, based on the judgment signal 6 outputted when the SSC tolerance of the CDR circuit 16 is limited, by the frequency tracking control circuit 15.

Figure 4A:
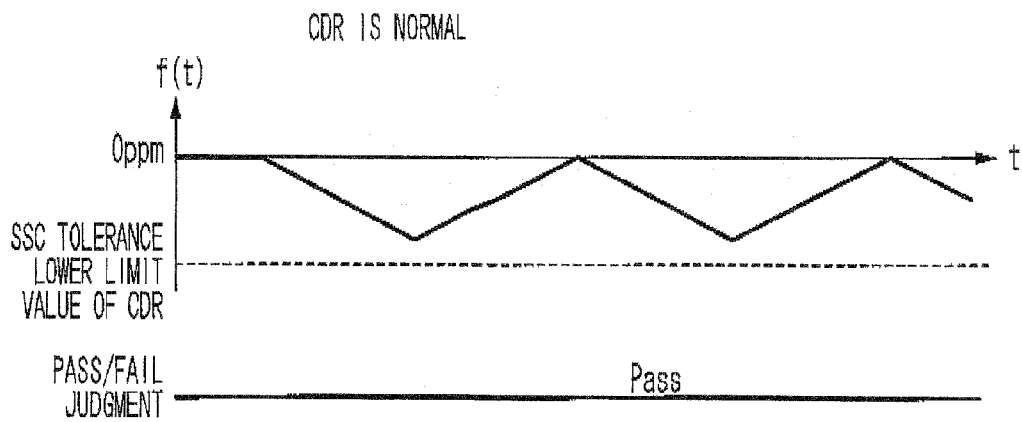
FIGS. 4A to 4C are examples of timing charts in loop back tests according to the present invention.
Figure 4B:
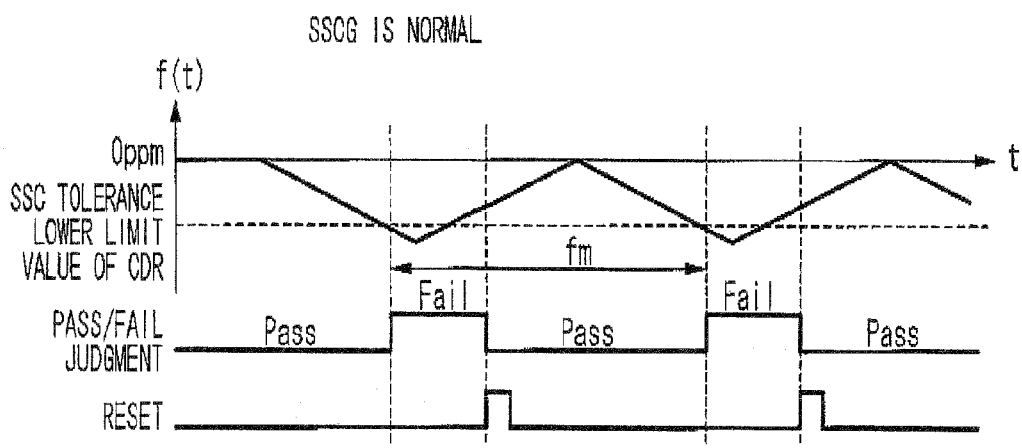
Figure 4C:
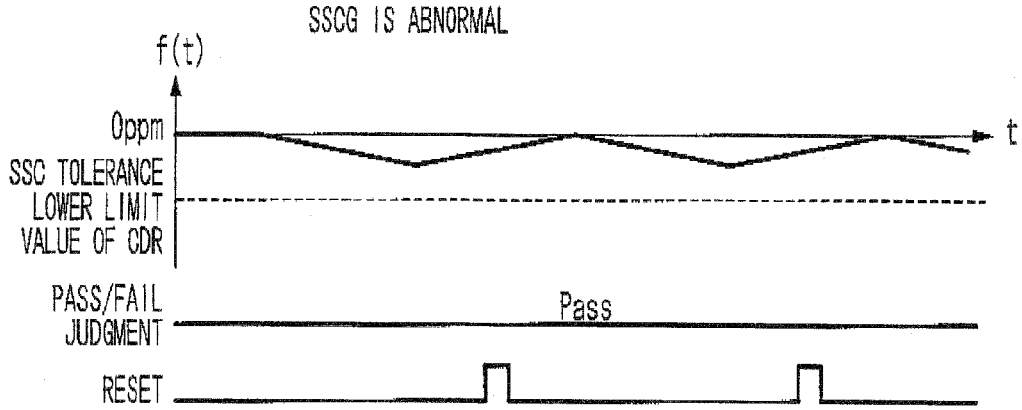

The operation of the test circuit with respect to the loop back test according to the present invention will be described below in detail, with reference to FIGS. 4A, 4B, 4C, 5A, 5B, 6A and 6B. At first, the setting of the SSC tolerance of the CDR circuit 16 and the process for detecting the presence or absence of the abnormality of the CDR circuit 16 and the SSCG 17, which are executed by the frequency tracking control circuit 15, are explained in detail with reference to FIGS. 4A, 4B and 4C. FIGS. 4A to 4C are examples of timing charts in a loop back test according to the present invention.

The loop back test executed in this case is carried out by dividing it into a usual test mode and a modulation fault detection mode. Here, in the usual test mode, the SSC tolerance of the CDR circuit 16 is controlled to the same setting as the usual operation by the frequency tracking control circuit 15. In the modulation fault detection mode, the SSC tolerance of the CDR circuit 16 is set at the performance lower than that of the usual operation.

FIG. 4A indicates timing charts of the profile of the spread spectrum clock, the frequency limit value (the SSC tolerance lower limit value) that can be tracked by the CDR circuit 16, and the Pass/Fail judgment signal 6, in the usual test mode. Here, a broken line indicates the profile of the spread spectrum clock. A dashed line indicates the frequency limit value (the SSC tolerance lower limit value). A straight line with a letter of "Pass" indicates the Pass/Fail judgment signal 6. Here, a case when the modulation is carried out by a down spread method of performing the frequency modulation on the modulation frequency only in the low frequency side with respect to the central frequency of the reference clock signal 1 will be explained below, as one example.

The normal SSCG 17 generates the spread spectrum clock at the modulation frequency within the range that can be tracked by the CDR circuit 16. That is, if the SSCG 17 is normal (is in a normal state), the modulation deviation is changed within the SSC tolerance of the CDR circuit 16 as shown in FIG. 4A. For this reason, if the modulation deviation has the normal value, the CDR circuit 16 can track the modulation deviation, and the pattern comparator 14 outputs the judgment signal 6 indicative of "Pass". At this time, if the SSC tolerance of the CDR circuit 16 is abnormal (is in an abnormal state), the pattern data 3 and the parallel data 5 are not coincident, and the pattern comparator 14 outputs the judgment signal 6 indicative of "Fail".

FIG. 4B indicates timing charts of the profile of the spread spectrum clock, the frequency limit value (the SSC tolerance lower limit value), and the Pass/Fail judgment signal 6, in the modulation fault detection mode. Here, a broken line indicates the profile of the spread spectrum clock. A dashed line (horizontal direction) indicates the frequency limit value (the SSC tolerance lower limit value). A broken line with letters of "Pass" and "Fail" indicates the Pass/Fail judgment signal 6. A broken line under the Pass/Fail judgment signal 6 indicates the reset signal 2.

With reference to FIG. 4B, in the modulation fault detection mode, the frequency tracking control circuit 15 sets the SSC tolerance of the CDR circuit 16 to be lower than that of the usual operation (FIG. 4A). Here, the SSC tolerance lower limit value of the CDR circuit 16 is set to be higher than that of the usual operation. In details the SSC tolerance lower limit value is set such that the frequency band in which the CDR circuit 16 cannot normally attain the clock data recovery is generated, even if the SSCG 17 is normally operated. That is, the SSC tolerance lower limit value of the CDR circuit 16 is set such that the judgment signal 6 indicative of "Fail" is outputted, even if the spread spectrum clock is normal, as shown in FIG. 4B.

The pattern comparator 14 carries out the comparing process between the pattern data 3 and the parallel data 5, on the basis of the reset signal 2 that is cyclically inputted. For this reason, even if the "Fail" state occurs (the judgment signal 6 becomes "Fail") as the result when the CDR circuit 16 cannot track the modulation frequency, this is recovered by the reset signal 2, and the comparing process is cyclically started. Also, since the modulation deviation is cyclically varied, the pattern data 3 and the parallel data 5 become cyclically inconsistent (the CDR circuit 16 cannot track). For this reason, the judgment signal 6 indicative of "Fail" is cyclically (for each time fm) outputted.

FIG. 4C indicates timing charts of the profile of the spread spectrum clock, the frequency limit value (the SSC tolerance lower limit value), and the Pass/Fail judgment signal 6, in the modulation fault detection mode. Here, a broken line indicates the profile of the spread spectrum clock. A dashed line (horizontal direction) indicates the frequency limit value (the SSC tolerance lower limit value). A straight line with a letter of "Pass" indicates the Pass/Fail judgment signal 6. A broken line under the Pass/Fail judgment signal 6 indicates the reset signal 2.

FIG. 4C indicates a situation that the SSCG 17 is abnormal (is in an abnormal state) and the spread spectrum clock is generated at the deviation which does not satisfy the desirable modulation deviation. In the modulation fault detection mode, the SSC tolerance lower limit value of the CDR circuit 16 is set to be higher than that of the usual operation, as mentioned above. Even if the SSC tolerance lower limit value of the CDR circuit 16 is set as mentioned above, the CDR circuit 16 accurately performs the clock data recovery on the input serial signal. Thus, the pattern comparator 14 continues to output the judgment signal 6 indicative of "Pass". For this reason, the tester 20 judges the SSCG 17 to be abnormal, if the judgment signal 6 indicative of "Pass" is continuously inputted in the period exceeding the time fm.

Although not shown, there is a case that the SSCG 17 is abnormal and the spread spectrum clock is not generated at the desirable modulation deviation. That is, there is a case that the profile exhibits the waveform different from FIG. 4A and exceeds the SSC tolerance of the CDR circuit 16. In such a case, an output cycle of the judgment signal 6 indicative of "Fail" exhibits the value different from the time fm. For this reason, the tester 20 judges the SSCG 17 to be abnormal, if the judgment signal 6 indicative of "Fail" is inputted at the cycle different from the time fm during the test. At this time, the tester 20 is preferred to store the time fm when the SSC tolerance of the CDR circuit 16 at the modulation fault detection mode is set.

In this way, the frequency tracking control circuit 15 creates the state ("Fail" state) in which the CDR circuit 16 cannot accurately attain the clock data recovery, when the SSCG 17 is normally operated. The tester 20 stores the content and/or output cycle of the judgment signal 6 at this time, and if the tester 20 receives the judgment signal 6 that differs from this content and/or output cycle, the tester 20 judges that the SSCG 17 is abnormal.

Figure 5A:
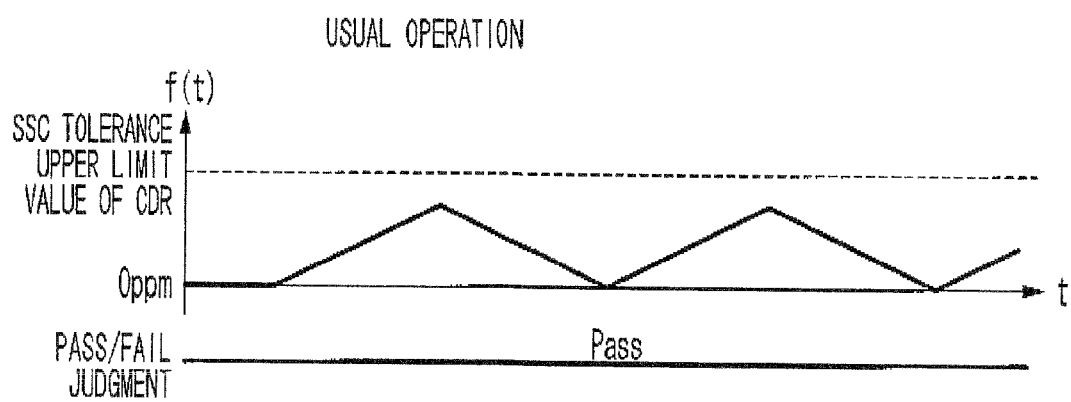
FIGS. 5A and 5B are examples of timing charts in the loop back tests according to the present invention.
Figure 5B:
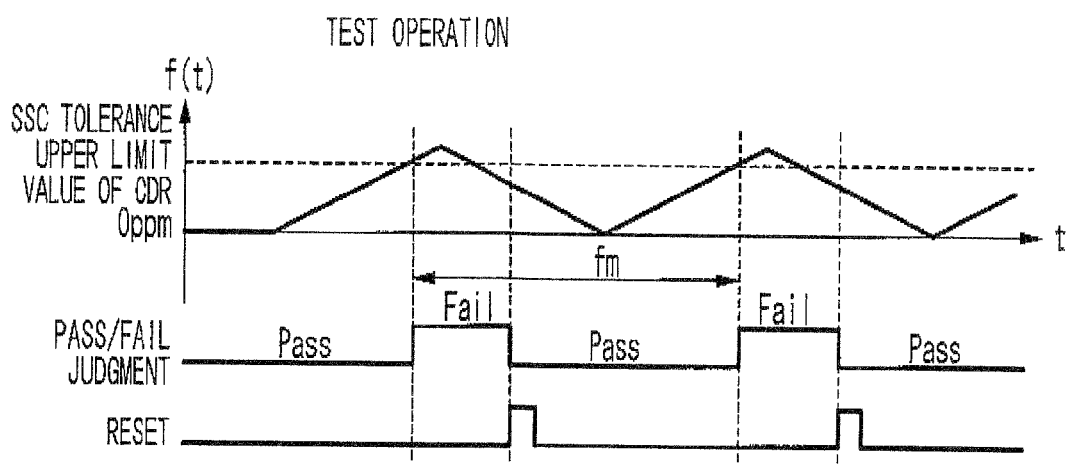

The test can be similarly performed on the SSCG 17 that employs an up-spread method of performing the frequency modulation on the modulation frequency only in the high frequency side with respect to the central frequency of the reference clock signal 1 as shown in FIGS. 5A to 5B. FIGS. 5A to 5B are other examples of timing charts in a loop back test according to the present invention.

FIG. 5A indicates timing charts of the frequency limit value (the SSC tolerance upper limit value) that can be tracked by the CDR circuit 16, the profile of the spread spectrum clock, and the Pass/Fail judgment signal 6, in the usual test modes. Here, a dashed line indicates the frequency limit value (the SSC tolerance upper limit value). A broken line indicates the profile of the spread spectrum clock. A straight line with a letter of "Pass" indicates the Pass/Fail judgment signal 6.

FIG. 5B indicates timing charts of the frequency limit value (the SSC tolerance upper limit value), the profile of the spread spectrum clock, and the Pass/Fail judgment signal 6, in the modulation fault detection mode. Here, a dashed line (horizontal direction) indicates the frequency limit value (the SSC tolerance upper limit value). A broken line indicates the profile of the spread spectrum clock. A broken line with letters of "Pass" and "Fail" indicates the Pass/Fail judgment signal 6. A broken line under the Pass/Fail judgment signal 6 indicates the reset signal 2.

In this case, by replacing the SSC tolerance lower limit described in the case of FIGS. 4A to 4C with the SSC tolerance upper limit, the frequency tracking control circuit 15 controls this value so that the SSC tolerance is reduced at the time of the modulation fault detection mode. Consequently, the loop back test can be executed as described in the case of FIGS. 4A to 4C.

Figure 6A:
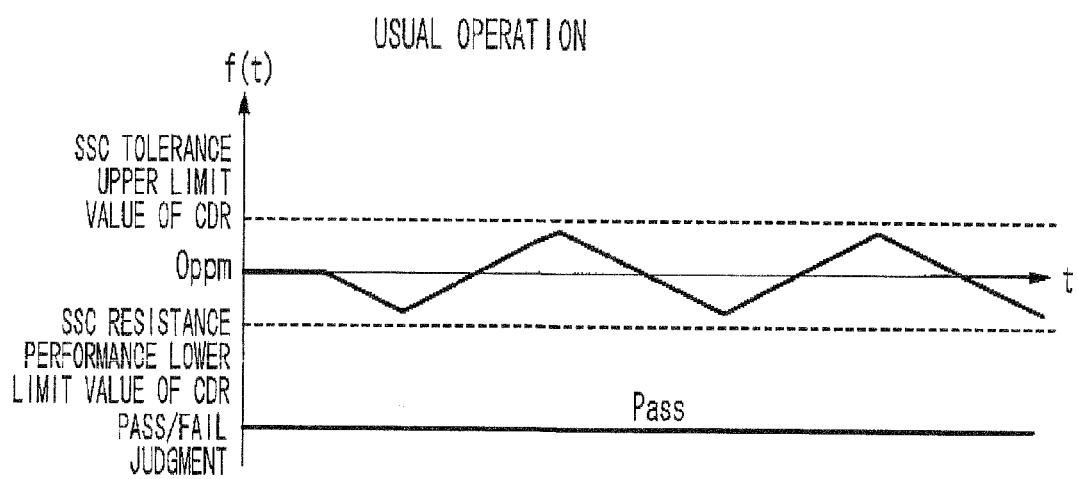
FIGS. 6A and 6B are examples of timing charts in the loop back tests according to the present invention.
Figure 6B:
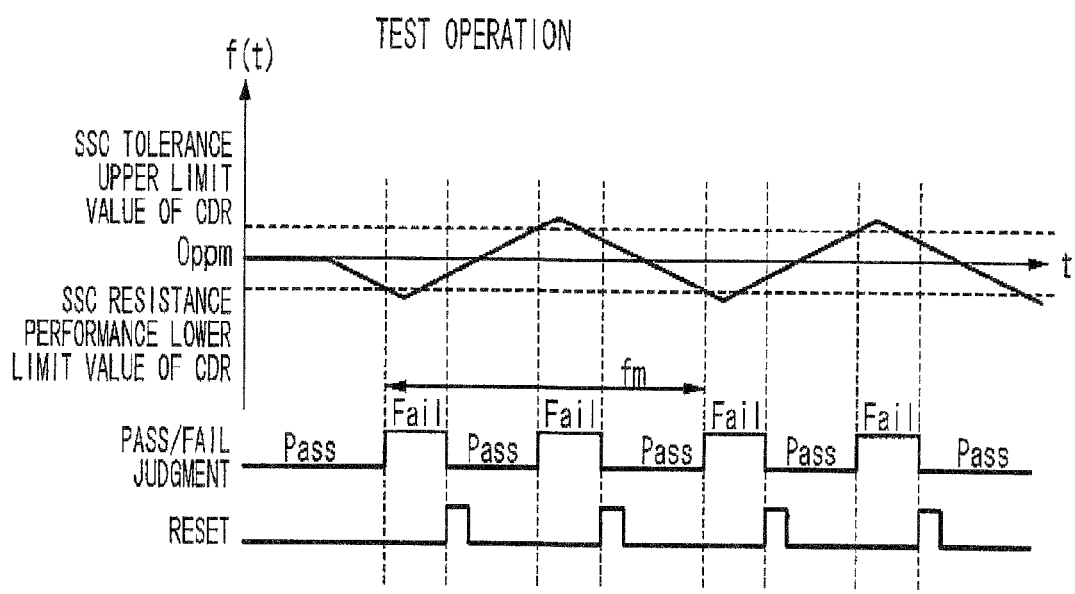

Also, the test can be similarly performed on the SSCG 17 that employs a center-spread method of performing the frequency modulation on the modulation frequency in both of the high frequency side and the low frequency side with respect to the central frequency of the reference clock signal 1 as shown in FIGS. 6A to 6B. FIGS. 6A to 6B are other examples of timing charts in a loop back test according to the present invention.

FIG. 6A indicates timing charts of the frequency limit values (the SSC tolerance upper and lower limit values) that can be tracked by the CDR circuit 16, the profile of the spread spectrum clock, and the Pass/Fail judgment signal 6, in the usual test mode. Here, upper and lower dashed lines indicate the frequency limit values (the SSC tolerance upper and lower limit values). A broken line indicates the profile of the spread spectrum clock. A straight line with a letter of "Pass" indicates the Pass/Fail judgment signal 6.

FIG. 6B indicates timing charts of the frequency limit values (the SSC tolerance upper and lower limit values), the profile of the spread spectrum clock, and the Pass/Fail judgment signal 6, in the modulation fault detection mode. Here, upper and lower dashed lines (horizontal direction) indicates the frequency limit values (the SSC tolerance upper and lower limit values). A broken line indicates the profile of the spread spectrum clock. A broken line with letters of "Pass" and "Fail" indicates the Pass/Fail judgment signal 6. A broken line under the Pass/Fail judgment signal 6 indicates the reset signal 2.

In this case, by replacing the SSC tolerance lower limit described in the case of FIGS. 4A to 4C with the SSC resistance range (the upper and low limits), the frequency tracking control circuit 15 controls those values so that the SSC tolerance is reduced at the time of the modulation fault detection mode. Consequently, the loop back test can be executed as described in the case of FIGS. 4A to 4C.

In this way, according to the present invention, the presence or absence of the abnormality of the SSCG 17 can be detected in the modulation fault detection mode. Thus, the concurrent use of the usual test mode and the modulation fault detection mode can detect even the presence or absence of the abnormality of the CDR circuit 16.

Next, a setting operation for the SSC tolerance of the CDR circuit 16 executed by the frequency tracking control circuit 15 will be described below in detail with reference to FIGS. 7 to 11.

Figure 7:
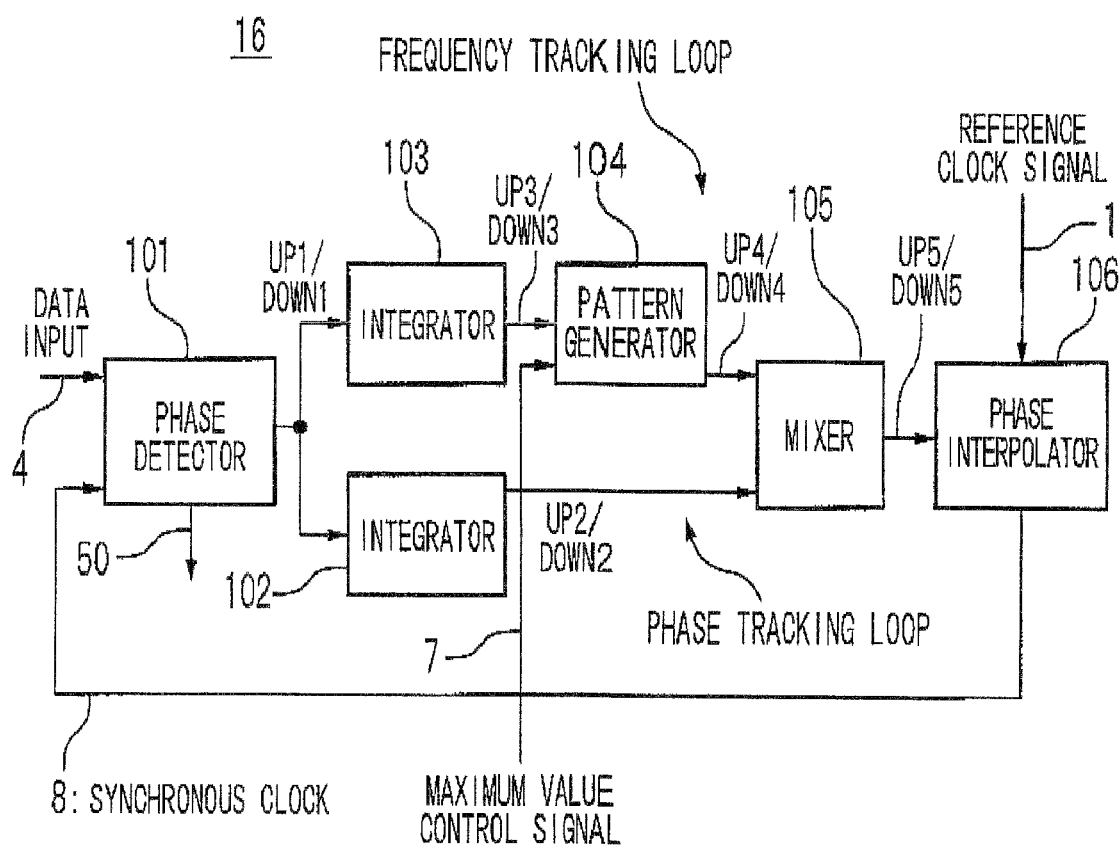
FIG. 7 is a block diagram showing a configuration of a CDR circuit according to the present invention.

FIG. 7 is a block diagram showing a configuration of a CDR circuit according to the present invention. As one example of the CDR circuit 16, there is the clock data recovery circuit described in JP-P 2005-5999A (corresponding to US2004252804A1). The CDR circuit 16 includes a phase detector 101, integrators 102, 103, a pattern generator 104, a mixer 105 and a phase interpolator 106. In the CDR circuit 16, the synchronous clock 8 is fed back through a frequency tracking loop and a phase tracking loop, and this makes the synchronous clock 8 track the bit rate of the input serial data 4. Here, the frequency tracking loop is created by the phase detector 101, the integrator 103, the pattern generator 104, the mixer 105, the phase interpolator 106, the phase detector 101. The phase tracking loop is created by the phase detector 101, the integrator 102, the mixer 105, the phase interpolator 106, the phase detector 101.

The phase detector 101 compares the phases between the serial data 4 and the synchronous clock 8 and outputs control signals UP1/DOWN1 indicating whether the phase of the synchronous clock 8 is delayed or advanced in comparison to that of the serial data 4.

The integrator 102 averages the control signals UP1/DOWN1 and outputs control signals UP2/DOWN2. The integrator 103 averages the control signals UP1/DOWN1 and outputs control signals UP3/DOWN3. Each of the integrators 102, 103 includes an up/down counter, which carries out an up-count when receiving the control signal UP1 from the phase detector 101 and carries out a down-count when receiving the control signal DOWN1 from the phase detector 101. Also, a counting range of the up/down counter included in the integrator 102 is different from that of the up/down counter included in the integrator 103. Here, for example, the integrator 102 includes the up/down counter that can carry out the counting in the range between 4 and −4. The integrator 103 includes the up/down counter that can carry out the counting in the range between 63 and −63.

The pattern generator 104 outputs control signals UP4/DOWN4 that are used for compensating the frequency based on the control signal UP3/DOWN3 (sets it active). The mixer 105 outputs control signals UP5/DOWN5 used for compensating the phase of the clock by the interpolator 106, based on the control signals UP4/DOWN4 from the pattern generator 104 and the control signals UP2/DOWN2 from the integrator 102. As one example of the mixer 105, there is the mixer described in JP-P 2005-5999A (corresponding to US2004252804A1). The phase interpolator 106 compensates the phase of the reference clock signal 1 and carries out the phase control so that the phase of the synchronous clock 8 comes close to that of the serial data 4.

When the bit rate of the serial data 4 inputted to the phase detector 101 and the frequency of the synchronous clock 8 are equal, it may be enough to have a function of the phase tracking loop to match the phases of both of the serial data 4 and the synchronous clock 8. When the bit rate of the serial data 4 inputted to the phase detector 101 and the frequency of the synchronous clock 8 are different, the frequency tracking loop is operated. For example, when the bit rate of the serial data 4 becomes delayed in comparison to the frequency of the synchronous clock 8, the phase detector 101 sets the control signal DOWN1 active, and the integrator 102 generates the control signal DOWN2 in which the control signal DOWN1 is integrated, and delays the phase of the synchronous clock 8 from the phase interpolator 106.

In the case of the frequency difference, under which the bit rate of the serial data 4 does not still catch up with the frequency of the synchronous clock 8 even if the phase of the synchronous clock 8 is made delayed, the phase detector 101 continuously output the control signal DOWN1 (the control signal DOWN1 is set at a logic 1 during a plurality of clock cycles), and the integrator 103 outputs the control signal DOWN3. Receiving the control signal DOWN3, the pattern generator 104 outputs the control signal DOWN4 for compensating the frequency (sets it active).

As mentioned above, it is possible to make the frequency of synchronous clock 8 track the bit rate of the serial data 4.

Figure 9:
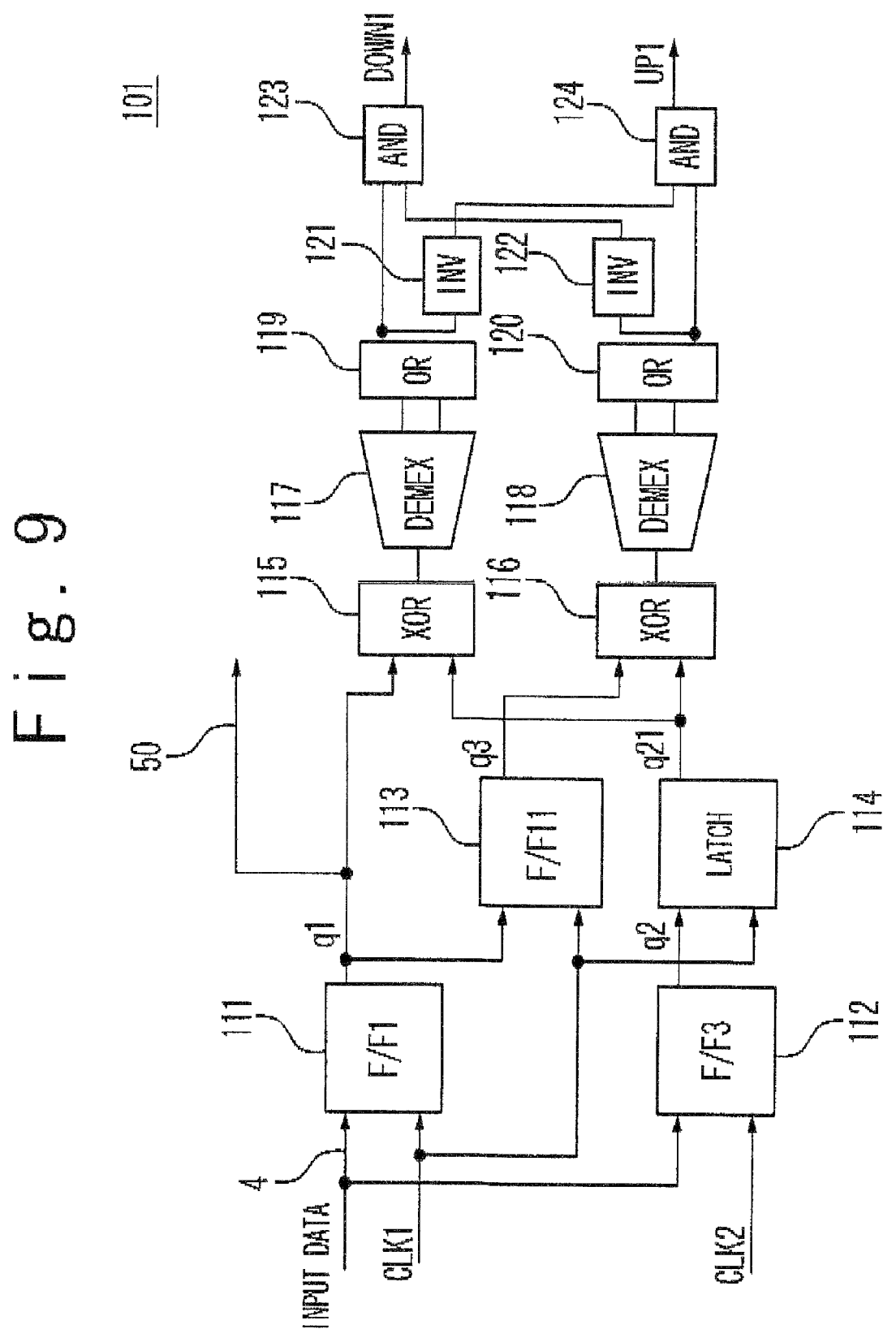

Next, the configuration of the phase detector 101 will be explained below. FIG. 9 is a block diagram showing a configuration of the phase detector included in the CDR circuit according to the present invention. The phase detector 101 receives the serial data 4 in synchronization with a two-phase clock (a synchronous clock signal CLK1 and a synchronous clock signal CLK2) based on the synchronous clock 8. The phase detector 101 includes a flip-flop (FF1) 111 (a flip-flop with an edge trigger), a flip-flop (FF3) 112, a flip-flop (FF11) 113, a latch 114 (a through latch), exclusive OR circuits (XOR) 115, 116, de-multiplexers (DEMUX circuits) 117, 118, OR circuits 119, 120, inverters 121, 122, and AND circuits 123, 124.

The flip-flop (FF1) 111 outputs an output signal q1 based on the serial data 4 and the synchronous clock signal CLK1. The flip-flop (FF3) 112 outputs an output signal q2 based on the serial data 4 and the synchronous clock signal CLK2 whose phase is opposite to the synchronous clock signal CLK1. The flip-flop (FF11) 113 outputs an output signal q3 based on the output signal q1 and the synchronous clock signal CLK1, to the exclusive OR circuit (XOR) 116. The latch 114 outputs an output signal q21 based on the output signal q2 and the synchronous clock signal CLK1, to the exclusive OR circuits (XOR) 115, 116. The exclusive OR circuit (NOR) 115 outputs an exclusive OR between the output signal q1 and the output signal q21 to the DEMUX circuit 117. The exclusive OR circuit (XOR) 116 outputs the exclusive OR between the output signal q3 and the output signal q21 to the DEMUX circuit 118. The DEMUX circuit 117 parallel converts the signal serially supplied from the exclusive OR circuit (XOR) 115 into converted signals and then, outputs the converted signals. The DEMUX circuit 118 parallel converts the signal serially supplied from the exclusive OR circuits (XOR) 116 into converted signals and then, outputs the converted signals. Here, one serial input is converted into two parallel outputs in each of the DEMUX circuits 117, 118. The OR circuit 119 outputs the logical sum of the outputs from the DEMUX circuit 117. The OR circuit 120 outputs the logical sum of the outputs from the DEMUX circuit 118. The inverter 122 inverts the output from the OR circuit 120 into an inverted outputs. The AND circuit 123 outputs the logical product of the output from the OR circuit 119 and the inverted output from the inverter 122 as the control signal DOWN1. The inverter 121 inverts the output from the OR circuit 119 into an inverted outputs. The AND circuit 124 outputs the logical product of the output from the OR circuit 120 and the inverted output from the inverter 121 as the control signal UP1. Here, the output q1 of the flip-flop (FF1) 111 is outputted as a synchronization data 50 which is converted into the parallel data 5 through a shift register (not shown).

In this way, the phase detector 101 in the CDR circuit 16 includes the two DEMUX circuits (for example, one serial two parallel converting circuits). Thus, the integrators 102, 103, the pattern generator 104 and the mixer 105, which are located at the later stages, are operated at the clock of the ½ frequency of the output clock of the phase interpolator 106. Also, the phase interpolator 106 is configured such that the phase can be changed at a resolution of 1/64. Then, when the control signal UP5 has the logic 1, the phase of the synchronous clock 8 is advanced by 1/64, and when the control signal DOWN5 has the logic 1, the phase of the output clock is delayed by 1/64. The control signals UP5/DOWN5 are operated at the clock of the ½ frequency. Thus, in the state that the logic 1 is always outputted, the synchronous clock 8 outputted by the phase interpolator 106 has the phase change at a rate of once every two times. Also, the average frequency of the synchronous clocks 8 becomes the frequency after the ±0.78125% modulation of the frequency of the reference clock signal 1 inputted to the phase interpolator 106. Hence, this implies that the SSC tolerance has the maximum of the ±0.78125% modulation.

On the other hand, because of the reason which will be described later, the SSC tolerance of the CDR circuit 16, namely, the clock frequency range in which the CDR circuit 16 can track the frequency is determined on the basis of the count range of the up/down counter in the pattern generator 104. A configuration and operation of the pattern generator 104 will be described below in detail.

Figure 8:
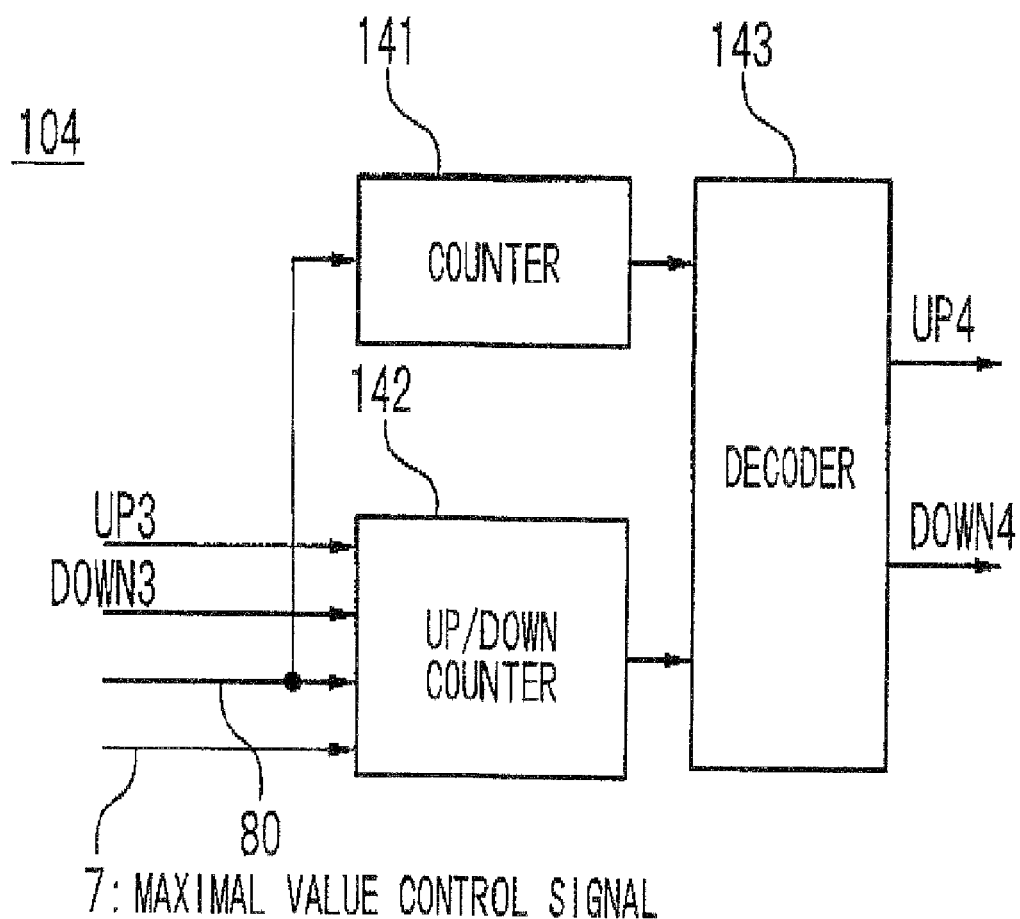
FIG. 8 is a block diagram showing a configuration of a pattern generator included in the CDR circuit according to the present invention.

FIG. 8 is a block diagram showing a configuration of a pattern generator included in the CDR circuit according to the present invention. The pattern generator 104 includes a counter 141, an up/down counter 142 and a decoder 143. The counter 141 carries out a count correspondingly to a two-division clock 80 of the synchronous clock 8 and measures a predetermined count value. For example, the counter 141 repeats the up count from 0 to 9. The up/down counter 142 carries out the up count or down count on the basis of the control signals UP3/DOWN3 within a predetermined count range. This count range is set for any value, based on the maximal value control signal 7 from the frequency tracking control circuit 15. For example, at the time of the usual operation of the SerDes 30, the count range is set for a range between −10 and 10. At the time of the modulation fault detection mode, the count range is set for the range smaller than the range between −10 and 10, for example, the range between −2 and 2, in order to limit the performance in comparison to that of the usual operation.

The decoder 143 decodes the count value inputted from the counter 141 and the count value inputted from the up/down counter 142 and outputs decoded signals as the control signals UP4/DOWN4.

In this way, the output values of the pattern generator 104 are controlled by the frequency tracking control circuit 15. The pattern generator 104 can usually increase the tracking performance of the CDR circuit 16, and suppress the tracking performance at the time of the test.

A specific operation of the CDR circuit 16 will be described below by using the case that the spread spectrum clock is modulated from the central frequency of the reference clock signal 1 to −0.78125%, as an example. Here, let us suppose that the integrator 102 is configured by the up/down counter between +4 and −4, the integrator 103 is configured by the up/down counter between +63 and −63, the counter 141 in the pattern generator 104 is configured by the up/down counter between 0 and 9, and the up/down counter 142 is configured by the up/down counter between +10 and −10.

In this case, the phase detector 101 always outputs the logic 1 to the control signal DOWN1. The integrator 102 repeats the down count from 0 to −4 in response to the control signal DOWN1 (the logic 1). Here, when the count value is −4 and the logic 1 is inputted to the control signal DOWN1, the logic 1 is outputted to the control signal DOWN2, and the count value is cleared to 0. The integrator 103 repeats the down count from 0 to −63 in response to the control signal DOWN1 (the logic 1). Here, when the count value is −63 and the logic 1 is inputted to the control signal DOWN1, the logic 1 is outputted to the control signal DOWN3, and the count value is cleared to 0.

Figure 10:
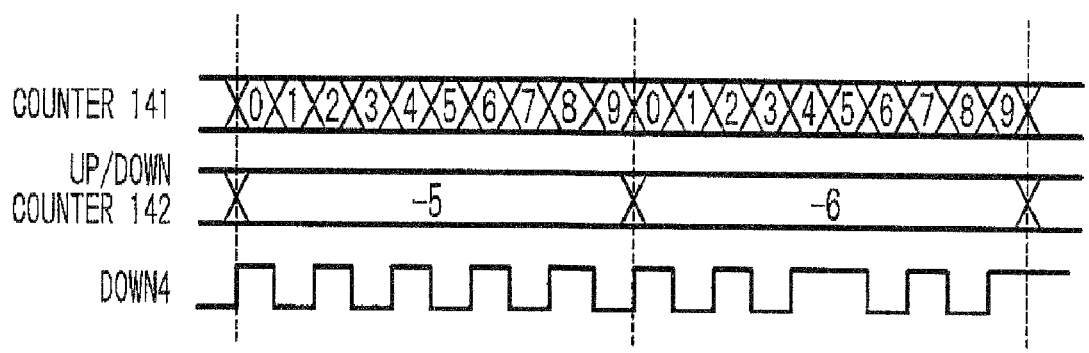
FIG. 10 is an example of a timing chart of a control signal outputted by the pattern generator included in the CDR circuit according to the present invention.

The counter 141 in the pattern generator 104 repeats the up count from 0 to 9 in response to the two-division clock 80 in the synchronous clock 8. The up/down counter 142 decreases the count value in response to the control signal DOWN3 (the logic 1) and sequentially executes the down count from 0 to 10, The decoder 143 outputs the logic 1 to the control signal DOWN4. The number of the outputs of the logic 1 outputted from the decoder 143 corresponds to the number of the counter values counted by the up/down counter 142 while the counter 141 counts from 0 to 9. FIG. 10 is an example of a timing chart of a control signal outputted by the pattern generator included in the CDR circuit according to the present inventions. For example, when the control signal DOWN3 (the logic 1) is inputted 5 times, the count value of the up/down counter 142 indicates −5. At this time, the logic 1 is outputted to the control signal DOWN4, five times out of ten times while the counter 141 counts up from 0 to 9. Similarly, when the count value of the up/down counter 142 indicates −6, the logic 1 is outputted to the control signal DOWN4, six times out of ten times. In the case of the −0.78125% modulation, the pattern generator 104 always outputs the logic 1 to the control signal DOWN4, and the integrator 102 outputs the logic 1 to the control signal DOWN2 at a rate of once every five times. In response to this, the mixer 105 always outputs the logic 1 as the control signal DOWN5. The phase interpolator 106 delays the phase of the synchronous clock 8 at a rate of once every two times. Consequently, the average frequency of the synchronous clock 8 becomes the frequency that is modulated to −0.78125%. Thus, it is possible to track the bit rate on which the −0.78125% modulation is performed.

As mentioned above, the control signals UP5/DOWN5 (the logic 1) outputted by the mixer 105 control the average frequency of the output clocks of the phase interpolator 106. Thus, controlling the rate (the number of times) of the logics 1 outputted to the control signals UP5/DOWN5 can control the SSC tolerance. The control signals UP5/DOWN5 are controlled by the control signals UP4/DOWN4 from the pattern generator 104 and the control signals UP2/DOWN2 from the integrator 102. Then, the rate at which the control signals UP4/DOWN4 become the logic 1 is higher than that of the control signals UP2/DOWN2. For this reason, the control signals UP4/DOWN4 influence the control signals UP5/DOWN5 greater than the control signals UP2/DOWN2. The control signals UP4/DOWN4 are controlled by the value of the up/down counter 142 in the pattern generator 104. In short, controlling the maximal value (the count range) of the up/down counter 142 can control the average frequency of the synchronous clocks outputted by the phase interpolator 106.

Figure 11:
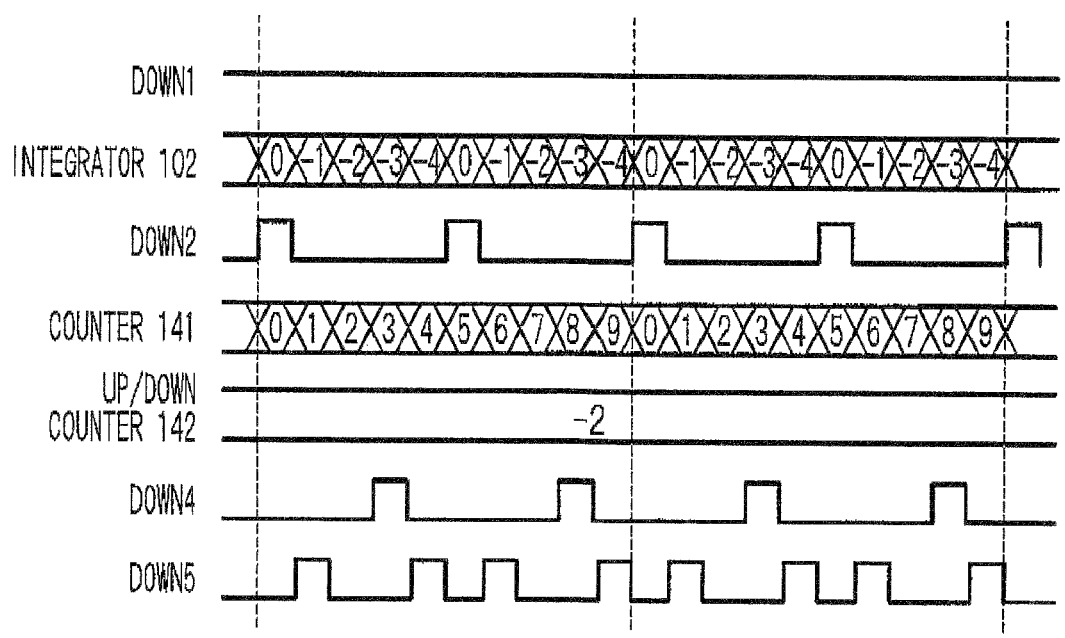
FIG. 11 is an example of a timing chart showing a clock data recovery operation in a modulation defect detection mode according to the present invention.

For example, when the maximal value of the up/down counter 142 is controlled to ±2 (the count range between −2 and 2), the SSC tolerance of the CDR circuit 16 can be suppressed such that this can track only up to the −0.31250% modulation. The clock data recovery operation in the CDR circuit 16 when the maximal value of the up/down counter 142 is controlled to ±2 in the above example will be described below with reference to FIG. 11. FIG. 11 is an example of a timing chart showing a clock data recovery operation in a modulation defect detection mode according to the present invention.

Similarly to the above case, the logic 1 is always outputted to the control signal DOWN1. The integrator 102 repeats the down count from 0 to −4, in response to the control signal DOWN1 (the logic 1). Here, when the count value is −4, the logic 1 is outputted to the control signal DOWN2 in response to the control signal DOWN1 (the logic 1). That is, the logic 1 is outputted to the control signal DOWN2, two out of ten counts. The counter 141 repeats the up count from 0 to 9, in response to the control signal DOWN3 (the logic 1). The up/down counter 142 decreases the count value in response to the control signal DOWN3 (the logic 1) and sequentially executes the down count from 0 to −2, Here, the maximal value of the up/down counter 142 becomes −2. The decoder 143 outputs the logic 1 to the control signal DOWN4. The number of the outputs of the logic 1 outputted from the decoder 143 corresponds to the number of count values "−2" counted by the up/down counter 142 while the counter 141 counts from 0 to 9. That is, the logic 1 is outputted to the control signal DOWN4, two out of ten counts. The mixer 105 outputs the logic 1 four out of ten counts based on the control signal DOWN2 and the control signal DOWN4. Thus, the phase interpolator 106 delays the phase of the synchronous clock B at a rate of four times per 20 clocks (=one time per five clocks). That is, since the frequency tracking control circuit 15 sets the maximal value of the up/down counter 142 to ±2, the frequency on which the CDR circuit 16 can perform the clock data recovery can be set from the central frequency to −0.31250%. In this way, controlling the maximal value of the up/down counter 142 can control the SSC tolerance of the CDR circuit 16. Incidentally, at the time of the usual operation or at the time of the usual test, the frequency tracking control circuit 15 sets the maximal value of the up/down counter 142 to ±10.

Second Embodiment

Figure 12:
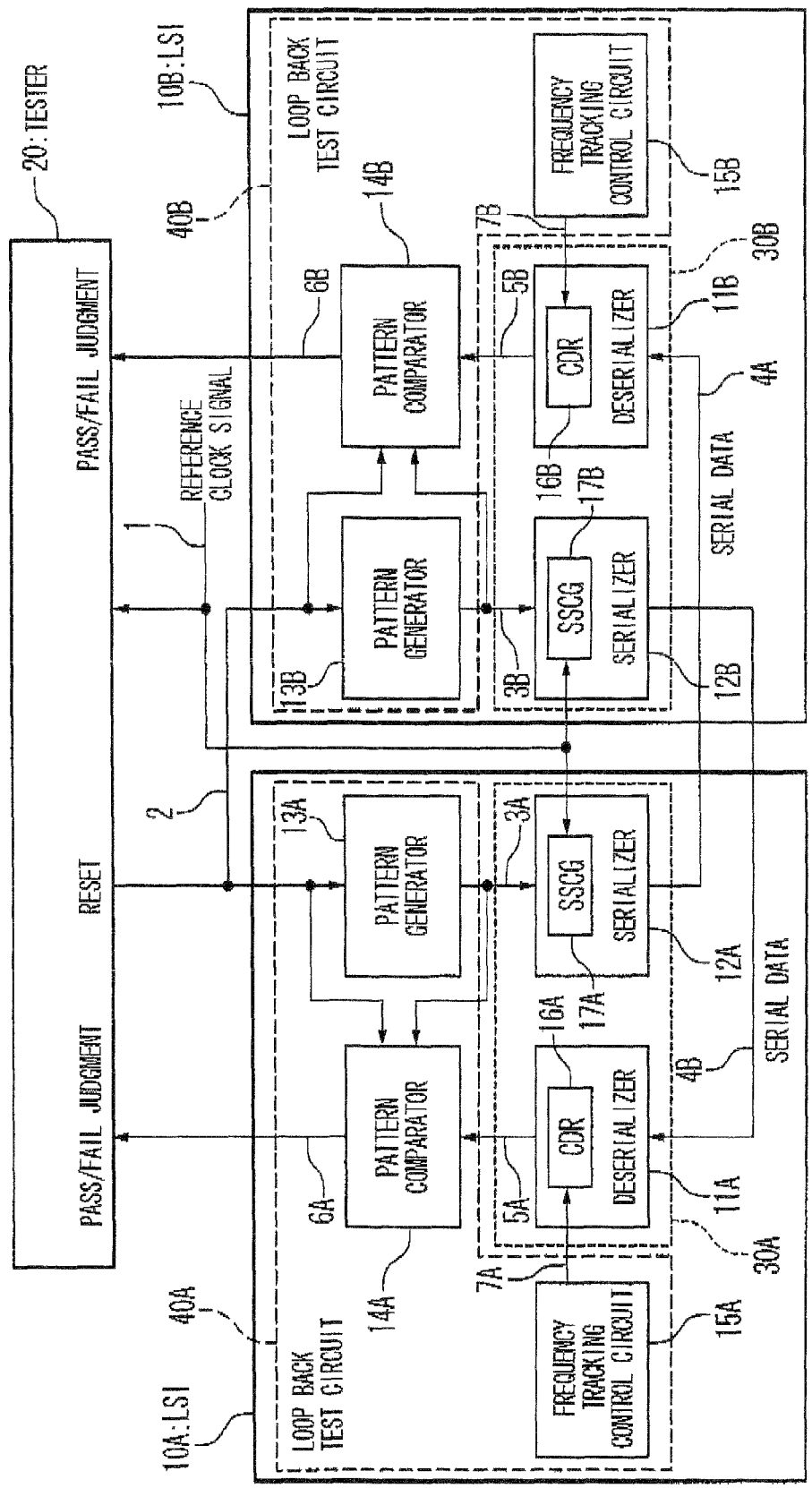
FIG. 12 is a block diagram showing a configuration in a second embodiment of a test circuit according to the present invention.

A second embodiment of a configuration and an operation of a test circuit according to the present invention will be described below with reference to FIG. 12. FIG. 12 is a block diagram showing a configuration in a second embodiment of a test circuit according to the present invention. In the loop back test in the first embodiment, the test is executed such that the loop back of the serial data 4 is carried out in one LSI 10. In the second embodiment, a plurality of LSIs (for example, LSIs 10A, 10B) each having the configuration similar to the LSI 10 are prepared, and the serial data converted in each SerDes is inputted to the other SerDes, and the test similar to the foregoing test is consequently executed.

Hereafter, the reference letters equal or similar to those of the first embodiment indicate the equal, similar or equivalent configuration members. Then, in order to discriminate the configurations and signals in the LSI 10A and LSI 10B, one of "A" and "B" is added to the respective reference letters, and the explanations are executed. Also, the configurations and operations different from those of the first embodiment will be described below.

A pattern generator 13A in the LSI 10A outputs a test pattern 3A which is the same as a test pattern 3B outputted by a pattern generator 13B in the LSI 10B. A serializer 12A converts a test pattern 3A into a serial data 4A. A serializer 12B converts a test pattern 3B into a serial data 413. The serializer 12A outputs a serial data 4A to a deserializer 11B in the LSI 10B, and the serializer 12B outputs a serial data 4B to a deserializer 11A in the LSI 10A.

The deserializer 11A converts the input serial data 43 into a parallel data 5A and outputs it to a pattern comparator 14A. The deserializer 11B converts the input serial data 4A into a parallel data 5B and outputs it to a pattern comparator 14B. The pattern comparator 14A compares the test patterns 3A with the parallel data 5A based on the serial data 4B serialized by the serializer 12B in the other LSI 10B, and output a judgment signal 6A based on the comparison result to the tester 20. The pattern comparator 14B compares the test patterns 3B with the parallel data 5B based on the serial data 4A serialized by the serializer 12A in the other LSI 10A, and output a judgment signal 6B based on the comparison result to the tester 20.

The tester 20 detects the presence or absence of the abnormality of an SSCG 17B installed in the LSI 10B based on the judgment signal 6A. The tester 20 also detects the presence or absence of the abnormality or an SSCG 17A installed in the LSI 10A based on the judgment signal 6B. At this time, the tester 20 stores the cycle fm in the "Fail" state at the time of the usual test mode in each of the LSI 10A and the LSI 10B. The tester 20 may compare the cycle fm at the time of each normal state with the cycle when the "Fail" state is detected at the time of the modulation fault detection mode to carry out the abnormality judgment of the SSCG 17A and the SSCG 17B. Also, the same reference clock signal 1 and the same reset signal 2 are preferred to be inputted to the LSI 10A and the LSI 10B.

As mentioned above, the test is executed by loop-backing the serial data 4 into the other SerDes. Thus, it is possible to improve the reliability of the SSCG fault detection.

The LSI 10 according to the present invention can control the SSC tolerance of the CDR circuit 16 only by specifying the count range of the up/down counter 142. That is, only adding the small control circuit (frequency tracking control circuit 15) can control the SSC tolerance of the CDR circuit 16. Also, the SerDes in which the CDR circuit is built can be used to execute the SSC transmission/reception test for detecting the presence or absence of the abnormality of the SSCG.

As mentioned above, according to the semiconductor device and the test circuit and the test method for testing the semiconductor device, according to the present invention, it is possible to check the presence or absence of the abnormality of the spread spectrum clock generator.

Also, the SerDes in which the CDR circuit is installed in the deserializer can be used to detect the presence or absence of the abnormality of the spread spectrum clock generator.

Moreover, it is possible to detect the presence or absence of the abnormality of the CDR circuit and the spread spectrum clock generator, which are installed in the SerDes.

Moreover, it is possible to control the frequency bandwidth (SSC tolerance) that can be tracked by the CDR circuit.

As mentioned above, the embodiments of the present invention have been detailed. However, the specific configuration is not limited to the above-mentioned embodiments. Even the change in the range without departing from the scope of the present invention is included in the present invention.

It is apparent that the present invention is not limited to the above embodiment, but may be modified and changed without departing from the scope and spirit of the invention.

What is claimed is:

1. A semiconductor device comprising:
    a CDR (Clock Data Recovery) circuit configured to execute a clock data recovery on a serial data inputted synchronously with a spread spectrum clock; and
    a frequency tracking control circuit configured to control a bandwidth of frequency which can be tracked by said CDR circuit,
    a serializer configured to convert a first parallel data into said serial data and output said serial data synchronously with said spread spectrum clock;
    a deserializer configured to convert said serial data into a second parallel data and output said second parallel data synchronously with a synchronous clock recovered from said serial data by said CDR circuit;
    a pattern comparator configured to compare said first parallel data with said second parallel data and output a comparison result;
    a tester configured to judge one of presence and absence of an abnormality of a spread spectrum clock generator which generate said spread spectrum clock, based on said comparison result by said pattern comparator,
    wherein said pattern comparator outputs a first result signal indicating a pass as said comparison result when said first parallel data coincides with said second parallel data, and outputs a second result signal indicating a fault as said comparison result when said first parallel data does not coincide with said second parallel data,
    said frequency tracking control circuit controls said bandwidth of frequency such that said second result signal is outputted when said spread spectrum clock is modulated at a desired frequency, and
    said tester holds an input period of said second result signal in a case that said spread spectrum clock is modulated at a desired frequency, and judges that said spread spectrum clock generator is abnormal when said second result signal is inputted at a period different from said input period.

2. The semiconductor device according to claim 1, wherein said CDR circuit includes:
    a phase detector configured to compare a phase of said serial data with a phase of said synchronous clock,
    a pattern generator configured to generate a pattern data based on a comparison result by said phase detector, and
    a phase interpolator configured to interpolate a phase of a reference clock based on said pattern data and output said interpolated reference clock as said synchronous clock,
    wherein said pattern generator includes:
    an up/down counter configured to count up or count down based on said comparison result by said phase detector,
    wherein said pattern generator generates said pattern data based on a value in said up/down counter, wherein said frequency tracking control circuit outputs a control signal to said pattern generator to set an upper limit value and/or a lower limit value of said up/down counter.

3. The test circuit for testing a semiconductor device, according to claim 1, wherein said tester outputs a reset signal at a predetermined period,
said pattern comparator starts a comparison between said first parallel data and said second parallel data in response to said reset signal, and
said serializer starts an output of said serial data in response to said reset signal.

4. The test circuit for testing a semiconductor device, according to claim 3, wherein said tester outputs said reset signal synchronously with a reference clock, and
said serializer includes:
said spread spectrum clock generator configured to generate said spread spectrum clock based on said reference clock.

5. A test circuit for testing a semiconductor device, comprising:
a semiconductor device configured to include:
a CDR (Clock Data Recovery) circuit configured to execute a clock data recovery on a serial data inputted synchronously with a spread spectrum clock,
a frequency tracking control circuit configured to control a bandwidth of frequency which can be tracked by said CDR circuit,
a serializer configured to convert a first parallel data into said serial data and output said serial data synchronously with said spread spectrum clock,
a deserializer configured to convert said serial data into a second parallel data and output said second parallel data synchronously with a synchronous clock recovered from said serial data by said CDR circuit, and
a pattern comparator configured to compare said first parallel data with said second parallel data and output a comparison result; and
a tester configured to judge one of presence and absence of an abnormality of a spread spectrum clock generator which generate said spread spectrum clock, based on said comparison result by said pattern comparator,
wherein said pattern comparator outputs a first result signal indicating a pass as said comparison result when said first parallel data coincides with said second parallel data, and outputs a second result signal indicating a fault as said comparison result when said first parallel data does not coincide with said second parallel data,
said frequency tracking control circuit controls said bandwidth of frequency such that said second result signal is outputted when said spread spectrum clock is modulated at a desired frequency, and
said tester judges that said spread spectrum clock generator is abnormal when said second result signal is not inputted within a predetermined period.

6. The test circuit for testing a semiconductor device, according to claim 5, wherein said tester outputs a reset signal at a predetermined period,
said pattern comparator starts a comparison between said first parallel data and said second parallel data in response to said reset signal, and
said serializer starts an output of said serial data in response to said reset signal.

7. The test circuit for testing a semiconductor device, according to claim 6, wherein said tester outputs said reset signal synchronously with a reference clock, and
said serializer includes:
said spread spectrum clock generator configured to generate said spread spectrum clock based on said reference clock.

8. The test circuit for testing a semiconductor device, according to claim 5, wherein said CDR circuit includes:
a phase detector configured to compare a phase of said serial data with a phase of said synchronous clock,
a pattern generator configured to generate a pattern data based on a comparison result by said phase detector, and
a phase interpolator configured to interpolate a phase of a reference clock based on said pattern data and output said interpolated reference clock as said synchronous clock,
wherein said pattern generator includes:
an up/down counter configured to count up or count down based on said comparison result by said phase detector,
wherein said pattern generator generates said pattern data based on a value in said up/down counter,
wherein said frequency tracking control circuit outputs a control signal to said pattern generator to set an upper limit value and/or a lower limit value of said up/down counter.

9. A semiconductor device comprising:
a first semiconductor device; and
a second semiconductor device,
wherein each of said first semiconductor device and said second semiconductor device includes:
a CDR (Clock Data Recovery) circuit configured to execute a clock data recovery on a serial data inputted synchronously with a spread spectrum clock,
a frequency tracking control circuit configured to control a bandwidth of frequency which can be tracked by said CDR circuit,
a serializer configured to convert a first parallel data into said serial data and output said serial data synchronously with said spread spectrum clock,
a deserializer configured to convert said serial data outputted by the other semiconductor device into a second parallel data and output said second parallel data synchronously with a synchronous clock recovered from said serial data by said CDR circuit, and
a pattern comparator configured to compare said first parallel data with said second parallel data and output a comparison result; and
a tester configured to judge one of presence and absence of an abnormality of a spread spectrum clock generator which generate said spread spectrum clock, based on said comparison result by said pattern comparator,
wherein said pattern comparator outputs a first result signal indicating a pass as said comparison result when said first parallel data coincides with said second parallel data, and outputs a second result signal indicating a fault as said comparison result when said first parallel data does not coincide with said second parallel data,
said frequency tracking control circuit controls said bandwidth of frequency such that said second result signal is outputted when said spread spectrum clock is modulated at a desired frequency, and
said tester holds an input period of said second result signal in a case that said spread spectrum clock is modulated at a desired frequency, and judges that said spread spectrum clock generator is abnormal when said second result signal is inputted at a period different from said input period.

10. The test circuit for testing a semiconductor device, according to claim 9, wherein said tester outputs a reset signal at a predetermined period, said pattern comparator starts a comparison between said first parallel data and said second parallel data in response to said reset signal, and said serializer starts an output of said serial data in response to said reset signal.

11. The test circuit for testing a semiconductor device, according to claim 10, wherein said tester outputs said reset signal synchronously with a reference clock, and said serializer includes:

said spread spectrum clock generator configured to generate said spread spectrum clock based on said reference clock.

12. A test circuit for testing a semiconductor device, comprising:

a semiconductor device configured to include:

a first semiconductor device, and a second semiconductor device, wherein each of said first semiconductor device and said second semiconductor device includes:

a CDR (Clock Data Recovery) circuit configured to execute a clock data recovery on a serial data inputted synchronously with a spread spectrum clock, a frequency tracking control circuit configured to control a bandwidth of frequency which can be tracked by said CDR circuit, a serializer configured to convert a first parallel data into said serial data and output said serial data synchronously with said spread spectrum clock, a deserializer configured to convert said serial data outputted by the other semiconductor device into a second parallel data and output said second parallel data synchronously with a synchronous clock recovered from said serial data by said CDR circuit, and a pattern comparator configured to compare said first parallel data with said second parallel data and output a comparison result; and a tester configured to judge one of presence and absence of an abnormality of a spread spectrum clock generator which generate said spread spectrum clock, based on said comparison result by said pattern comparator, wherein said pattern comparator outputs a first result signal indicating a pass as said comparison result when said first parallel data coincides with said second parallel data, and outputs a second result signal indicating a fault as said comparison result when said first parallel data does not coincide with said second parallel data, said frequency tracking control circuit controls said bandwidth of frequency such that said second result signal is outputted when said spread spectrum clock is modulated at a desired frequency, and said tester judges that said spread spectrum clock generator is abnormal when said second result signal is not inputted within a predetermined period.

13. The test circuit for testing a semiconductor device, according to claim 12, wherein said tester outputs a reset signal at a predetermined period, said pattern comparator starts a comparison between said first parallel data and said second parallel data in response to said reset signal, and said serializer starts an output of said serial data in response to said reset signal.

14. The test circuit for testing a semiconductor device, according to claim 13, wherein said tester outputs said reset signal synchronously with a reference clock, and said serializer includes:

said spread spectrum clock generator configured to generate said spread spectrum clock based on said reference clock.

15. A test method for testing a semiconductor device, which tests a spread spectrum clock generator generating a spread spectrum clock, said test method comprising:

a serializer converting a first parallel data into a serial data and outputting said serial data synchronously with said spread spectrum clock;

a frequency tracking control circuit controlling a bandwidth of frequency which can be tracked by a CDR (Clock Data Recovery) circuit;

said CDR circuit executing a clock data recovery on said serial data inputted synchronously with said spread spectrum clock and reproducing a synchronous clock from said serial data;

a deserializer converting said serial data into a second parallel data and outputting said second parallel data synchronously with said synchronous clock;

a pattern comparator comparing said first parallel data with said second parallel data and outputting a comparison result; and a tester judging one of presence and absence of an abnormality of said spread spectrum clock generator, wherein said comparing and outputting step includes:

said pattern comparator outputting a first result signal indicating a pass as said comparison result when said first parallel data coincides with said second parallel data, and outputting a second result signal indicating a fault as said comparison result when said first parallel data does not coincide with said second parallel data, wherein said controlling step includes:

said frequency tracking control circuit controlling said bandwidth of frequency such that said second result signal is outputted when said spread spectrum clock is modulated at a desired frequency, and wherein said judging step includes:

said tester judging that said spread spectrum clock generator is abnormal when said second result signal is not inputted within a predetermined period.

16. The test method for testing a semiconductor device, according to claim 15, wherein said judging step includes:

said tester, which holds an input period of said second result signal in a case that said spread spectrum clock is modulated at a desired frequency, judging that said spread spectrum clock generator is abnormal when said second result signal is inputted at a period different from said input period.

* * * * *